United States Patent
Kim et al.

(10) Patent No.: US 12,477,904 B2
(45) Date of Patent: Nov. 18, 2025

(54) ELECTROLUMINESCENCE DISPLAY

(71) Applicant: LG DISPLAY CO., LTD., Seoul (KR)

(72) Inventors: Moonsoo Kim, Gyeonggi-do (KR); Dohong Kim, Gyeonggi-do (KR)

(73) Assignee: LG Display Co., Ltd (KR)

( * ) Notice: Subject to any disclaimer, the term of this patent is extended or adjusted under 35 U.S.C. 154(b) by 353 days.

(21) Appl. No.: 18/206,104

(22) Filed: Jun. 6, 2023

(65) Prior Publication Data

US 2023/0403885 A1    Dec. 14, 2023

(30) Foreign Application Priority Data

Jun. 14, 2022    (KR) .................... 10-2022-0072230

(51) Int. Cl.
*H10K 59/131*    (2023.01)
*H10K 59/121*    (2023.01)
*H10K 59/122*    (2023.01)
*H10K 59/80*    (2023.01)

(52) U.S. Cl.
CPC ....... *H10K 59/122* (2023.02); *H10K 59/1213* (2023.02); *H10K 59/80517* (2023.02)

(58) Field of Classification Search
CPC ............ H10K 59/122; H10K 59/1213; H10K 59/80517; H10K 59/80515; H10K 59/131; H10K 71/861; H10K 50/814; H10K 50/813; H10K 50/818; H10K 50/82; H10K 59/123; H10K 59/124; H10K 59/35

See application file for complete search history.

(56) References Cited

FOREIGN PATENT DOCUMENTS

| KR | 2007-0024810 A | 3/2007 |
|---|---|---|
| KR | 2019-0072217 A | 6/2019 |

*Primary Examiner* — Donald L Raleigh
(74) *Attorney, Agent, or Firm* — Fish & Richardson P.C.

(57) ABSTRACT

A light emitting display includes a plurality of pixels disposed on a substrate. Each of the plurality of pixels includes: a first unit electrode; a second unit electrode apart from the first unit electrode; a conductive ohmic layer between the first unit electrode and the second unit electrode; a bank on the conductive ohmic layer, the bank covering circumferences of the first unit electrode and the second unit electrode, and exposing a central portion of the first unit electrode and the second unit electrode; an emission layer on the first unit electrode, the second unit electrode and the bank; and a cathode electrode on the emission layer.

20 Claims, 16 Drawing Sheets

ELECTROLUMINESCENCE DISPLAY

CROSS-REFERENCE TO RELATED APPLICATION

This application claims the priority of Korean Patent Application No. 10-2022-0072230 filed on Jun. 14, 2022, which is hereby incorporated by reference in its entirety.

BACKGROUND

Field of the Disclosure

The present disclosure relates to an electroluminescence display (or a light emitting display). In particular, the present disclosure relates to a light emitting display having a structure that can normalize defective pixels due to foreign materials or make only a part including of the foreign material of the defective pixels as dark spots.

Description of the Background

Various types of displays such as cathode ray tubes (CRTs), liquid crystal displays (LCDs), plasma display panels (PDPs) and electroluminescent displays have been developed. These various types of displays are used to display image data of various products such as computer, mobile phones, automated teller machines (ATMs), and vehicle navigation systems according to their unique characteristics and purposes.

In particular, an organic light emitting display, which is a self-luminous display, has excellent optical performance such as a wide viewing angle and color reproducibility closed to the natural color. Thus, its application fields have been gradually widening, and getting popular. With these advantages, it is attracting attention as the most suitable display for realizing an 8K pixel density ultra-high resolution display beyond 4K pixel density. The higher the resolution, the larger the number of pixels. As the number of pixels increases, the frequency of occurrence of defects in pixel increases due to foreign materials during the manufacturing process.

When defective pixel occurs, darkening process may be considered. When the number of defective pixels increases as the number of pixels increases, the number of pixels processed as dark dots also increases. Therefore, the defective pixel to normal pixels may be restored rather than to make a dark spot.

Various methods have been proposed for restoring the defective pixels to normal pixels. Most pixel recovery methods include a separated recovery structure or require additional recovery process. The structure and method of restoring the defective pixels presented so far have many problems in that the structure is very complicated or the cost increases as the additional repair process is performed, and so on. In particular, for a large-area display having a super ultra-high resolution, a new structure that does not have a special structure and recovers the defective pixel without a separate additional process is required.

The above information disclosed in this Background section is only for enhancement of understanding of the background of the described technology and therefore it may contain information that does not form prior art that is already known to a person of ordinary skill in the art.

SUMMARY

Accordingly, as for solving the problems described above, the present disclosure is to provide a light emitting display having a structure capable of restoring defective pixels in an aging process without a separated additional process.

In one aspect of the present disclosure, a light emitting display includes a plurality of pixels disposed on a substrate. Each of the plurality of pixels includes a first unit electrode; a second unit electrode apart from the first unit electrode with a predetermine distance; a conductive ohmic layer between the first unit electrode and the second unit electrode; a bank on the conductive ohmic layer, the bank covering circumferences of the first unit electrode and the second unit electrode, and exposing a central portion of the first unit electrode and the second unit electrode; an emission layer on the first unit electrode, the second unit electrode and the bank; and a cathode electrode on the emission layer.

In one aspect of the present disclosure, among the plurality of pixels, a pixel having a foreign material on the first unit electrode includes a gap and a disconnection pattern. The gap is formed between the foreign material and the emission layer, and between the foreign material and the cathode electrode for exposing the first unit electrode. The disconnection pattern cuts the connectivity between the cathode electrode and the first unit electrode.

In one aspect of the present disclosure, among the plurality of pixels, a pixel having a foreign material on the first unit electrode includes a gap exposing the first unit electrode by separating the foreign material and the emission layer, and connecting the cathode electrode to the first unit electrode. A portion of the conductive ohmic layer which connects the first unit electrode is removed.

In one aspect of the present disclosure, the bank fully covers the conductive ohmic layer.

In one aspect of the present disclosure, the bank covers a central portion of the conductive ohmic layer, and exposes circumferences of the conductive ohmic layer.

In one aspect of the present disclosure, among the plurality of pixels, a pixel having a foreign material on the conductive ohmic layer exposed from the bank on the first unit electrode includes a disconnection gap formed by removing the conductive ohmic layer around the foreign material.

In one aspect of the present disclosure, the light emitting display further includes a thin film transistor within the pixel on the substrate; a planarization layer covering the thin film transistor; and a pixel contact hole exposing some portions of the thin film transistor by penetrating the planarization layer. The first unit electrode, the second unit electrode, and the conductive ohmic layer are disposed on the planarization layer. The conductive ohmic layer connects the thin film transistor via the pixel contact hole.

In one aspect of the present disclosure, the light emitting display further comprises: a thin film transistor within the pixel on the substrate; a planarization layer covering the thin film transistor; a pixel contact hole exposing some portions of the thin film transistor by penetrating the planarization layer; and a central electrode connecting the thin film transistor via the pixel contact hole, and connecting the first unit electrode and the second unit electrode through the conductive ohmic layer. The first unit electrode, the second unit electrode, and the conductive ohmic layer are disposed on the planarization layer.

In one aspect of the present disclosure, the first unit electrode and the second unit electrode include: a first transparent conductive layer; a metal layer on the first transparent conductive layer; and a second transparent conductive layer on the metal layer. The conductive ohmic layer connects between the first unit electrode and the second unit electrode.

In one aspect of the present disclosure, the light emitting display further includes a third transparent conductive layer on the conductive ohmic layer, and connecting the second transparent conductive layers of the first unit electrode and the second unit electrode.

In one aspect of the present disclosure, the conductive ohmic layer contacts an upper surface of the second transparent conductive layer of the first unit electrode and an upper surface of the second transparent conductive layer of the second unit electrode.

In one aspect of the present disclosure, the conductive ohmic layer contacts a first bottom surface of the second transparent conductive layer on the metal layer of the first unit electrode, and contacts a second bottom surface of the second transparent conductive layer on the metal layer of the second unit electrode.

In one aspect of the present disclosure, the each pixel further includes: a third unit electrode apart from the first unit pixel and the second unit pixel; and a fourth unit pixel apart from the first unit pixel, the second unit pixel and the third unit pixel. The conductive ohmic layer connects between the first unit electrode and the third unit electrode, between the second unit electrode and the fourth unit electrode, and between the third unit electrode and the fourth unit electrode.

In one aspect of the present disclosure, the plurality of pixels includes: a red pixel having a first conductive ohmic layer with a first length; a green pixel having a second conductive ohmic layer with second length shorter than the first length; and a blue pixel having a third conductive ohmic layer with third length shorter than the second length.

In one aspect of the present disclosure, the plurality of pixels includes a red pixel, a green pixel and a blue pixel. The conductive ohmic layers disposed in the red pixel, the green pixel and the blue pixel have different lengths from each other.

In one aspect of the present disclosure, the conductive ohmic layers have the different lengths proportional to limit currents for driving the red pixel, the green pixel, and the blue pixel, respectively.

Further, a light emitting display comprising: a plurality of pixels each including a first unit electrode, a second unit electrode, a third unit electrode and a fourth unit electrode; a conductive ohmic layer electrically connecting the first, second, third and fourth unit electrodes; a bank disposed on the conductive ohmic layer and covering circumferences of the first, second, third and fourth unit electrodes; an emission layer disposed on the first, second, third and fourth unit electrodes and the bank; and a cathode electrode disposed on the emission layer.

In one aspect of the present disclosure, the conductive ohmic layer has a '+' shape and a central area overlapping with a pixel contact hole.

In one aspect of the present disclosure, the conductive ohmic layer includes an upper connection part extending upward from the central area, a lower connection part extending downward from the central area, a left connection part extending leftward from the central area, and a right connection part extending rightward from the central area.

In one aspect of the present disclosure, the conductive ohmic layer includes a domain material made of a resin material with a high electron mobility and a dopant for lowering a barrier energy of the domain material.

In one aspect of the present disclosure, the plurality of pixels includes a red pixel, a green pixel and a blue pixel. The conductive ohmic layer disposed in the red pixel, the green pixel and the blue pixel has a different length.

In one aspect of the present disclosure, a length of the conductive ohmic layer disposed in the red pixel, the green pixel and the blue pixel is proportional to limit current for driving the red pixel, the green pixel, and the blue pixel.

In the light emitting display according to the present disclosure, when an anode electrode (or a pixel electrode) is defected by falling of foreign material, the defective anode electrode may be restored without darkening the entire detective pixel. When an electrical short occurs between the anode electrode and the cathode electrode by falling of foreign material, the electrical short may be resolved and be restored to a normal state by performing an aging process. Here, the aging process is not a process prepared to restore the damaged (or defective) pixels, but means a process performed for stabilization before the light emitting display is released. That is, the light emitting display according to the present disclosure has a structure for restoring defective pixels by conducting the aging process without any additional recovery process. In particular, by restoring the short-circuit state of the anode electrode and the cathode electrode along the periphery of the foreign material to an insulating state, other emission areas of the pixel excluding the foreign material may be brought into a normal working state. In addition, the light emitting display according to the present disclosure has a structure in which an anode electrode is divided into a plurality of unit electrodes and connected by a conductive ohmic layer that has higher resistance than the unit electrode, to be removed by Joule heat. Accordingly, when the foreign material falls on the anode electrode, only certain unit electrode to which the foreign material has fallen may be darkened selectively. As a result, the present disclosure provides an ultra-high resolution light emitting display capable of restoring a defective pixel while minimizing the darkened area of the defective pixel.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
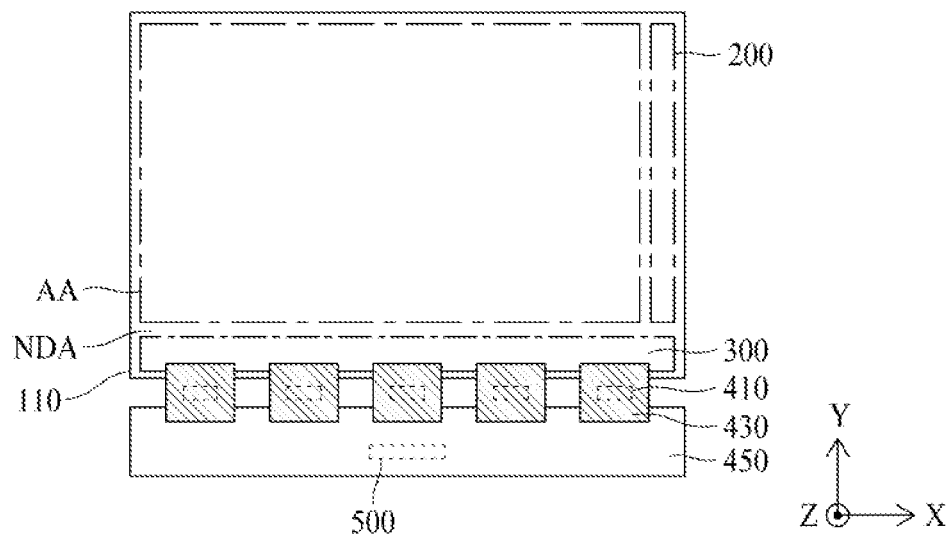
FIG. 1 is a plan view illustrating a schematic structure of a light emitting display according to the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these example aspects are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example aspects of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

Reference will now be made in detail to the exemplary aspects of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various aspects of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plan view illustrating a schematic structure of an electroluminescence display according to the present disclosure. In FIG. 1, X-axis refers to the direction parallel to the scan line, Y-axis refers to the direction of the data line, and Z-axis refers to the height direction of the display device.

Referring to FIG. 1, a light emitting display comprises a substrate 110, a gate (or scan) driver 200, a data pad portion 300, a source driving integrated circuit (IC) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area not representing the video images, may be defined at the circumference areas of the substrate 110 surrounding all or some of the display area AA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (Gate driver In Panel) type. GIP type means that the gate driver 200 is directly formed on the substrate 110.

The data pad portion 300 may supply the data signals to the data line according to the data control signal received from the timing controller 500. For another example, the data driving element may be made as a driver chip and mounted on the flexible film 430. Further, the flexible film 430 may be attached at the data pad 300 which is located at the non-display area NDA at anyone outside of the display area AA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a chip on film (COF) type or chip on plastic (COP) type.

The flexible circuit film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2:
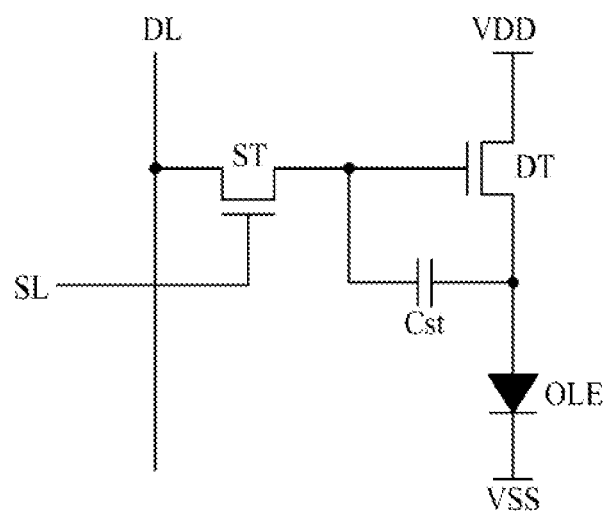
FIG. 2 is a circuit diagram illustrating a structure of one pixel included in the light emitting display according to the present disclosure.
Figure 3:
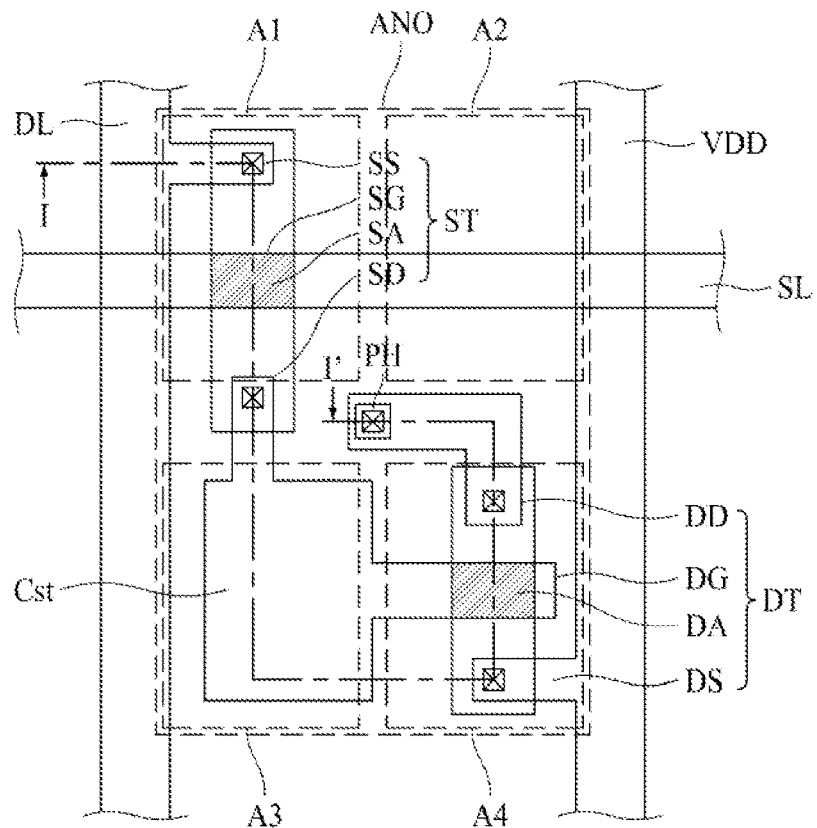
FIG. 3 is an enlarged plan view illustrating a structure of the pixel disposed in the light emitting display according to the present disclosure.
Figure 4:
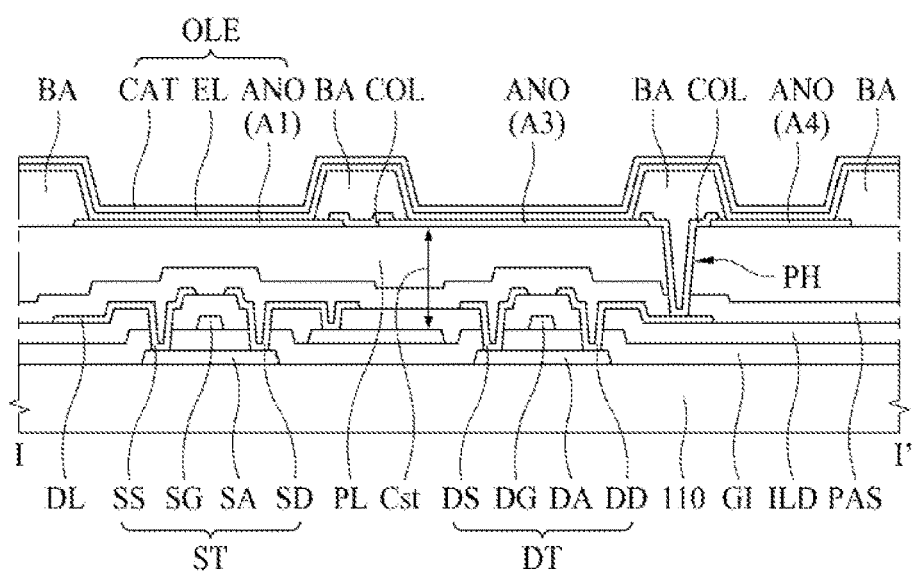
FIG. 4 is a cross-sectional view along cutting line I-I' in FIG. 3, for illustrating a structure of the light emitting display according to the present disclosure.

Hereinafter, referring to FIGS. 2 to 4, an aspect of the present disclosure will be explained. FIG. 2 is a circuit diagram illustrating a structure of one pixel included in the light emitting display according to the present disclosure. FIG. 3 is a plan view illustrating a structure of the pixels disposed in the light emitting display according to the present disclosure. FIG. 4 is a cross-sectional view along to cutting line I-I' in FIG. 3, for illustrating a structure of the light emitting display according to the first aspect of the present disclosure.

Referring to FIGS. 2 to 4, one pixel of the light emitting display may include a scan line SL, a data line DL and a driving current line VDD. A data pad 300 is disposed at the end of the data line DL. Even though it is not shown in figures, a scan pad may be disposed at the end of the scan line SL. One pixel of the light emitting display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate 110. For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be branched from the scan line SL, or as shown in FIG. 3, may be a portion of the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric currents flowing to the light emitting diode OLE from the driving current line VDD according to the voltage level of the driving gate electrode DG of the driving thin film transistor DT connected to the switching drain electrode SD of the switching thin film transistor ST.

FIG. 4 illustrates the thin film transistors ST and DT having a top-gate structure. Even though it is not shown in figures, for another example, the thin film transistors may have a bottom-gate structure. The bottom-gate structure is that the gate electrode is formed at first on the substrate, and then the semiconductor layer is formed on the gate insulating layer covering the gate electrode. The case of the light emitting display according to the present disclosure may have a thin film transistor with a top-gate structure to increase excellent aperture ratio which is the ratio of the emission area to the pixel area.

Further, in the top-gate structure shown in FIG. 4, the intermediate insulating layer ILD is deposited on the gate electrode SG and DG. The data line DL, the switching source electrode SS, the drain electrodes SD and DD and the driving current line VDD are formed on the intermediate insulating layer ILD. Here, the source electrode DS of the driving thin film transistor DT may be formed at the same layer as the driving gate electrode DG unlike the switching source electrode SS.

The light emitting diode OLE may include an anode electrode ANO, a light emitting layer EL and a cathode electrode CAT. The light emitting diode OLE may emit the light according to the amount of the electric current controlled by the driving thin film transistor DT. In other word, the light emitting diode OLE may be driven by the voltage differences between the low-level voltage and the high-level voltage controlled by the driving thin film transistor DT. The anode electrode ANO of the light emitting diode OLE may be connected to the drain electrode DD of the driving thin film transistor DT, and the cathode electrode CAT may be connected to a low-level voltage line Vss where a low-level potential voltage is supplied. That is, the light emitting diode OLE may be driven by the high-level voltage controlled by the driving thin film transistor DT and the low-level voltage supplied from the low-level voltage line Vss.

On the substrate 110 having the thin film transistors ST and DT, a passivation layer PAS may be deposited. The passivation layer PAS may be made of an inorganic material such as silicon oxide (SiOx) and silicon nitride (SiNx). A planarization layer PL may be deposited on the passivation layer PAS. The planarization layer PL may be a thin film for flattening or evening the non-uniform surface of the substrate 110 on which the thin film transistors ST and DT are formed. To do so, the planarization layer PL may be made of the organic materials. A pixel contact hole PH is formed in the passivation layer PAS and the planarization layer PL for exposing some portions of the drain electrode DD of the driving thin film transistor DT.

An anode electrode ANO is formed on the upper surface of the planarization layer PL. The anode electrode ANO may connect the drain electrode DD of the driving thin film transistor DT via the pixel contact hole PH. The anode electrode ANO may be made of different material according to the emitting structure. For the bottom emission type providing lights in the direction in which the substrate 110 is disposed, the anode electrode ANO may be made of transparent conductive material. For the top emission type providing lights in a direction opposite to the substrate 110, the anode electrode ANO may be made of at least one of silver (Ag), aluminum (Al), molybdenum (Mo), titanium (Ti), copper (Cu), gold (Au), magnesium (Mg), calcium (Ca) and barium (Ba), or alloy of them.

In the case of the present disclosure, a top emission type may be suitable for implementing ultra-high resolution over 2K pixel densities. In the top-emission type, the anode electrode ANO may be formed as having maximum area in the pixel area defined by the data line DL, the driving current line VDD and the scan line SL. In this case, the thin film transistors ST and DT may be disposed under the anode electrode ANO as being overlapped with the anode electrode ANO. In addition, some portions of the data line DL, the driving current line VDD and/or the scan line SL may be overlapped with the anode electrode ANO.

Referring to FIG. 4, the anode electrode ANO (or pixel electrode) may have a plurality of unit electrodes. For example, as shown in FIGS. 3 and 4, the anode electrode ANO may have a structure in which four unit electrodes A1, A2, A3 and A4 are separated in an island shape, and adjacent unit electrodes are connected by a conductive ohmic layer COL. As the cutting line I-I' is passing the first unit electrode A1, the third unit electrode A3 and the fourth unit electrode A4, only three unit electrodes are shown in FIG. 4. The detailed description for the anode electrode ANO may be explained later.

A bank BA is formed on the anode electrode ANO. The bank BA may be disposed as covering the circumferences of the anode electrode ANO, and exposing the middle portions of the anode electrode ANO. In addition, the bank BA is formed as fully covering the conductive ohmic layer COL. The detailed description about the relationship between the bank BA and the anode electrode ANO may be explained later.

An emission layer EL is disposed on the anode electrode ANO and the bank BA. The emission layer EL may be deposited over the entire display area AA to cover the anode electrode ANO and the bank BA. For an example, the emission layer EL may include at least two emission layers vertically stacked for emitting white light. For example, the emission layer EL may include a first emission layer and a second emission layer for generating white light by mixing the first light from the first emission layer and the second light from the second emission layer.

For another example, the emission layer EL per each pixel may include any one of blue emission layer, green emission layer and red emission layer corresponding to the light designated to each pixel. In this case, the emission layer EL may be disposed on each emission area defined by the bank BA. Further, the light emitting diode OLE may include functional layer for enhancing the emission efficiency and/or lifetime of the emission layer EL.

A cathode electrode CAT may be disposed on the emission layer EL as making a surface contact with the emission layer EL. The cathode electrode CAT may deposited over the entire substrate 110 to be commonly connected to the emission layers disposed on all pixels. In the case of the top-emission type, the cathode electrode CAT may be made of a transparent conductive material such as indium-tin-oxide (ITO) and indium-zinc-oxide (IZO).

Figure 5:
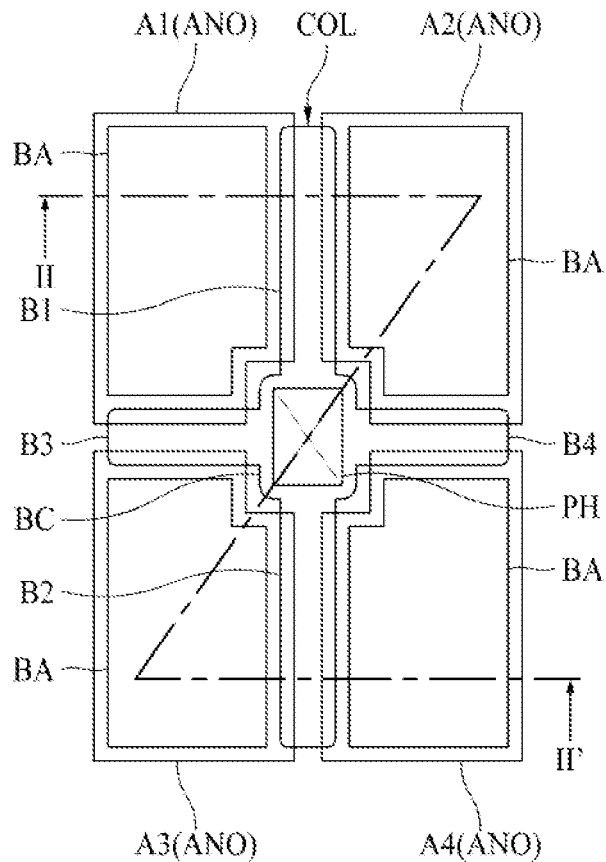
FIG. 5 is an enlarged plan view illustrating a structure of one normal pixel which is not defective in the light emitting display according to a first aspect of the present disclosure.
Figure 6:
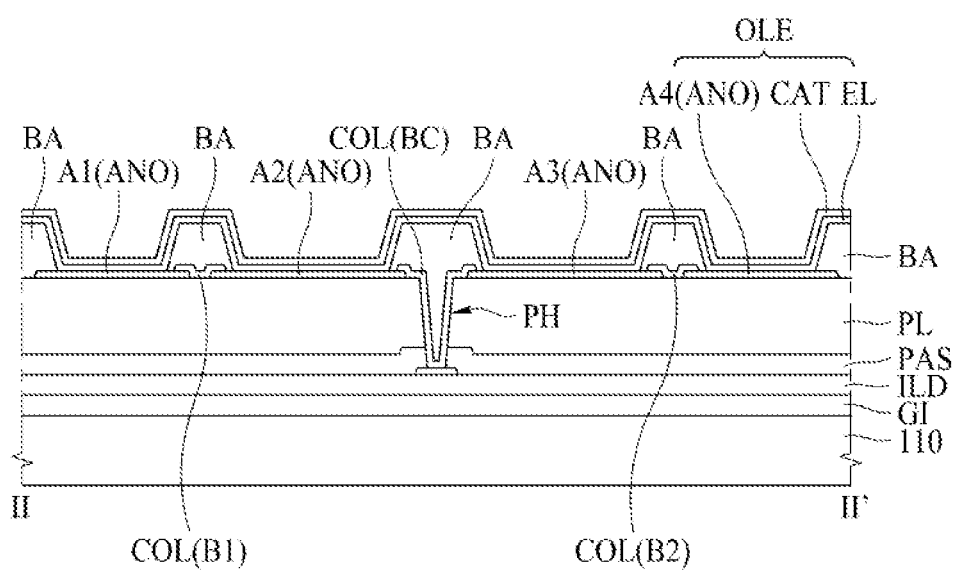
FIG. 6 is a cross-sectional view along cutting line II-II' in FIG. 5, for illustrating a structure of one normal pixel of the light emitting display according to the first aspect of the present disclosure.

Hereinafter, referring to FIGS. 5 and 6, a structure of a normal pixel of the light emitting display according to a first aspect of the present disclosure will be explained. FIG. 5 is an enlarged plan view illustrating a structure of one normal pixel which is not defective in the light emitting display according to the first aspect of the present disclosure. FIG. 6 is a cross-sectional view along cutting line II-II' in FIG. 5, for illustrating a structure of one normal pixel of the light emitting display according to the first aspect of the present disclosure. In the following description, detailed explanations same with those previous description will not be duplicated. Parts shown with reference numerals in FIGS. 5 and 6 but not described may have the same structure as the previous description.

FIGS. 5 and 6 are drawings for illustrating the structure of an anode electrode ANO disposed in one pixel of the light emitting display according to the first aspect of the present disclosure. The anode electrode ANO according to the first aspect of the present disclosure includes four unit electrodes A1, A2, A3 and A4. Four unit electrode may be arranged in a 2×2 matrix manner. For example, the first unit electrode A1 may be disposed at the first row first column, the second unit electrode A2 may be disposed at the first row second column, the third unit electrode A3 may be disposed at the second row first column, and the fourth unit electrode A4 may be disposed at the second row second column. Four unit electrodes A1, A2, A3 and A4 may be arranged with a predetermined gap each other. The pixel contact hole PH may be disposed at the central portion where four unit electrodes A1, A2, A3 and A4 commonly face each other.

Four unit electrodes A1 to A4 are connected with each other by a conductive ohmic layer COL. For example, the conductive ohmic layer COL may have a '+' shape with the central area BC overlapping with the pixel contact hole PH as a center point. In detail, the conductive ohmic layer COL may include an upper connection part B1 extending upward from the central area BC, a lower connection part B2 extending downward from the central area BC, a left connection part B3 extending leftward from the central area BC, and a right connection part B4 extending rightward from the central area BC.

The upper connection part B1 may connect the first unit electrode A1 and the second unit electrode A2. The lower connection part B2 may connect the third unit electrode A3 and the fourth unit electrode A4. The left connection part B3 may connect the first unit electrode A1 and the third unit electrode A3. The right connection part B4 may connect the second unit electrode A2 and the fourth unit electrode A4.

For example, the conductive ohmic layer COL may include a domain material made of a resin material with a high electron mobility and a dopant for lowering the barrier energy of the domain material. The resin materials having a high electron mobility that may include one of Alq3, TmPyPB, Bphen, TAZ and TPB. Alq3 may be an abbreviation of 'Tris(8-hydroxyquinoline) Aluminum', and be a complex having a chemical formula of $Al(C_9H_6NO)_3$. TmPyPB may be an organic material that is an abbreviation of '1,3,5-tri(m-pyrid-3-yl-phenyl) benzene'. Bphen may be an organic material that is an abbreviation of 'Bathophenanthroline'. TAZ may be an organic material that is an abbreviation of '1,2,3-triazole'. TPB may be an organic material that is an abbreviation for triphenyl bismuth. Since these organic materials have high electron mobility, they may be used in a light emitting element.

The material of the dopant may include an alkali-based doping material. For example, the material of the dopant may include one of lithium (Li), cesium (Cs), cesium oxide ($Cs_2O_3$), cesium nitride ($CsN_3$), rubidium (Rb) and rubidium oxide ($Rb_2O$). In another example, the material of the dopant may include fullerene having high electron mobility. Fullerene may be a generic term for molecules in which carbon atoms are arranged in a sphere, ellipsoid or cylinder shape. For example, the material of the dopant may include Buckminster-fullerene (C60) in which 60 carbon atoms are mainly bonded in the shape of a soccer ball. In addition, the material of the dopant may include higher fullerenes such as C70, C76, C78, C82, C90, C94 and C96.

The conductive ohmic layer COL may have the same materials as the electron transporting layer or electron injecting layer included into the emission layer EL. However, unlike the electron transporting layer or the electron injecting layer, the conductive ohmic layer COL may have higher electron mobility than the electron transporting layer or the electron injecting layer. For example, the electron transporting layer or the electron injecting layer may have an electron mobility of $1.0 \times 10^{-4}$ (S/m) to $9.0 \times 10^{-2}$ (S/m), whereas the conductive ohmic layer COL may have an electron mobility of $1.0 \times 10^{-2}$ (S/m) to $9.0 \times 10^{+1}$ (S/m). For this, the conductive resin materials included into the conductive ohmic layer COL may have a dopant content higher than that of the electron transporting layer or the electron injecting layer.

For example, the electron transporting layer or the electron injecting layer has a dopant doping concentration of 0% to 5%, whereas the conductive ohmic layer COL may be a conductive resin material having a dopant doping concentration of 10% to 30%. In particular, the doping concentration of the dopant in the conductive ohmic layer COL may be larger than that of the dopant in the electron transporting layer or the electron injecting layer. The domain material itself, in which the dopant has a doping concentration of 0%, may have an electrical conductivity of $1.0 \times 10^{-4}$ (S/m) to $1.0 \times 10^{-3}$ (S/m). By doping 3% to 30% of dopant into the domain material, the conductive ohmic layer COL may have improved electrical conductivity to $1.0 \times 10^{-2}$ (S/m) to $9.0 \times 10^{+1}$ (S/m), to be used as an element for connecting the unit electrodes A1 to A4 of the anode electrode ANO each other.

In addition, the conductive ohmic layer COL may have higher electric resistance than four unit electrodes A1 to A4 of the anode electrode ANO. When a foreign material falls on any one of four unit electrodes A1 to A4 and shorts to the cathode electrode CAT, the unit electrode having the foreign material may be electrically separated from other unit electrodes by using Joule heating process.

The bank BA is formed on the anode electrode ANO. In detail, the bank BA may be formed to expose the middle region of each of the four unit electrodes A1 to A4 of the anode electrode ANO and to cover the circumference regions of each unit electrode. In this case, the bank BA may be formed as covering all of the upper connection part B1, the lower connection part B2, the left connection part B3 and the right connection part B4 of the conductive ohmic layer COL FIGS. 5 and 6 show the shape of the pixel in the light emitting display according to the first aspect of the present disclosure. That is, FIGS. 5 and 6 show the shape of normal pixel without any foreign material falling thereon. In the normal state, the emission layer EL and the cathode electrode CAT are sequentially deposited on the anode electrode ANO. So, the normal light emitting diode OLE is formed and works normally.

Figure 7:
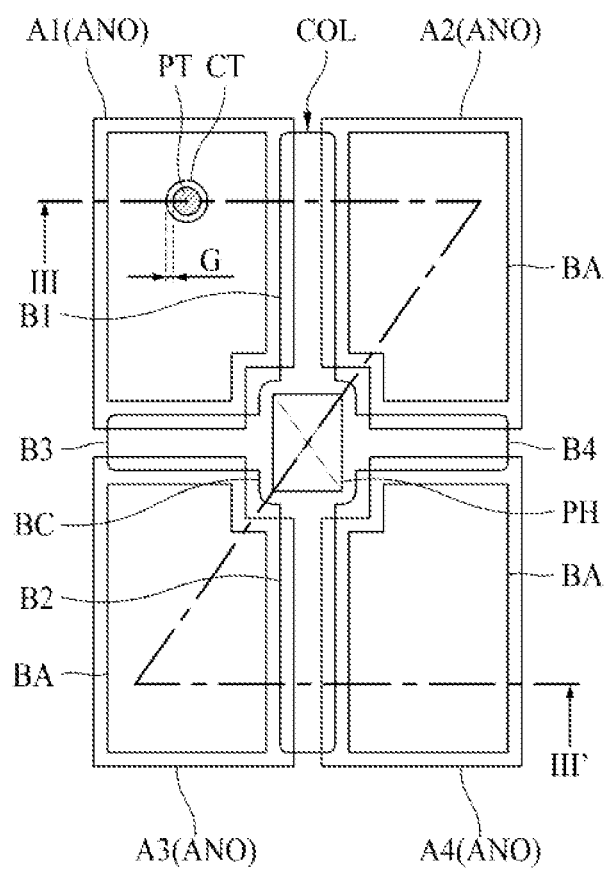
FIG. 7 is an enlarged plan view illustrating a structure in which defective pixel caused by foreign material are restored, in the light emitting display according to the first aspect of the present disclosure.
Figure 8:
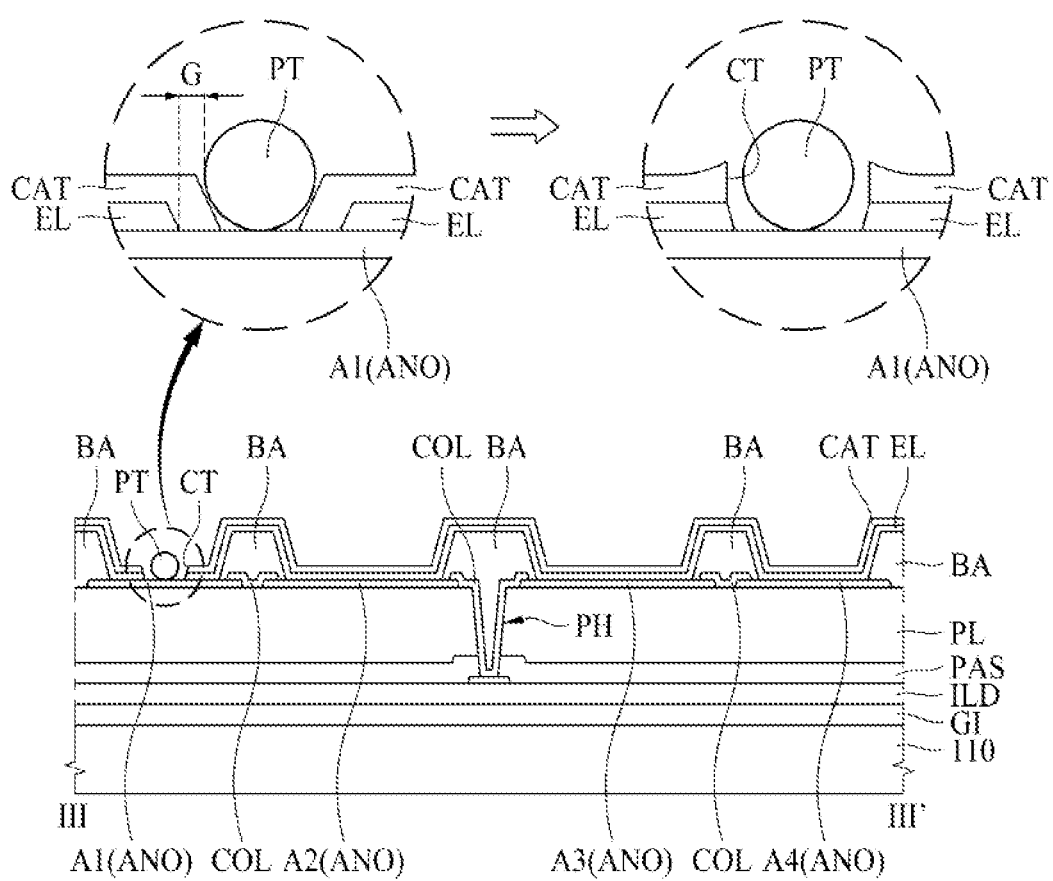
FIG. 8 is a cross-sectional view along cutting line III-III' in FIG. 7, for illustrating a structure in which defective pixel caused by foreign material are restored, in the light emitting display according to the first aspect of the present disclosure.

Hereinafter, referring to FIGS. 7 and 8, a structure for restoring defective pixels due to foreign material in the light emitting display according to the first aspect of the present disclosure will be explained. FIG. 7 is an enlarged plan view illustrating a structure in which defective pixel caused by foreign material are restored, in the light emitting display according to the first aspect of the present disclosure. FIG. 8 is a cross-sectional view, along cutting line in FIG. 7, for illustrating a structure in which defective pixel caused by foreign material are restored, in the light emitting display according to the first aspect of the present disclosure. In the following description, detailed explanations same with those previous description will not be duplicated. Parts shown with reference numerals in FIGS. 7 and 8 but not described may have the same structure as the previous description.

Under a condition in which the foreign material PT is dropped on the first unit electrode A1, the emission layer EL and the cathode electrode CAT may be sequentially stacked. In this case, as shown in left circle of FIG. 8, the emission layer EL may be stacked in a cut shape around the foreign material PT to form a predetermined gap G between the emission layer EL and the foreign material PT. After that, when the cathode electrode CAT is deposited thereon, the cathode electrode CAT may be also deposited in the gap G between the emission layer EL and the foreign material PT, so that the cathode electrode CAT and the first unit electrode A1 come into contact, and the electrical short is occurred.

After completing the light emitting display in this way, an aging process of applying anode voltage and cathode voltage to the anode electrode ANO and the cathode electrode CAT, respectively, is performed. Then, the portion, where the first unit electrode A1 and the cathode electrode CAT are connected at the gap G between the emission layer EL and the foreign material PT, may be melted to form the disconnection pattern CT (or cutoff pattern).

During the aging process, the normal operating voltages of the light emitting diode OLE is applied. Since the portion of the cathode electrode CAT in contact with the first unit electrode A1 forms a very thin at the gap G, this portion may have a high resistance. Therefore, during the aging process, the cathode electrode CAT in contact with the first unit electrode A1 may be melted due to a Joule heating by the high resistance. As a result, connection between the first unit electrode A1 and the cathode electrode CAT is disconnected at the gap G, and the disconnection pattern CT is formed.

The short circuit problem between the cathode electrode CAT and the anode electrode ANO caused by the foreign material PT falling on the first unit electrode A1 is resolved, and the first unit electrode A1 returns to a normal driving state.

Figure 9:
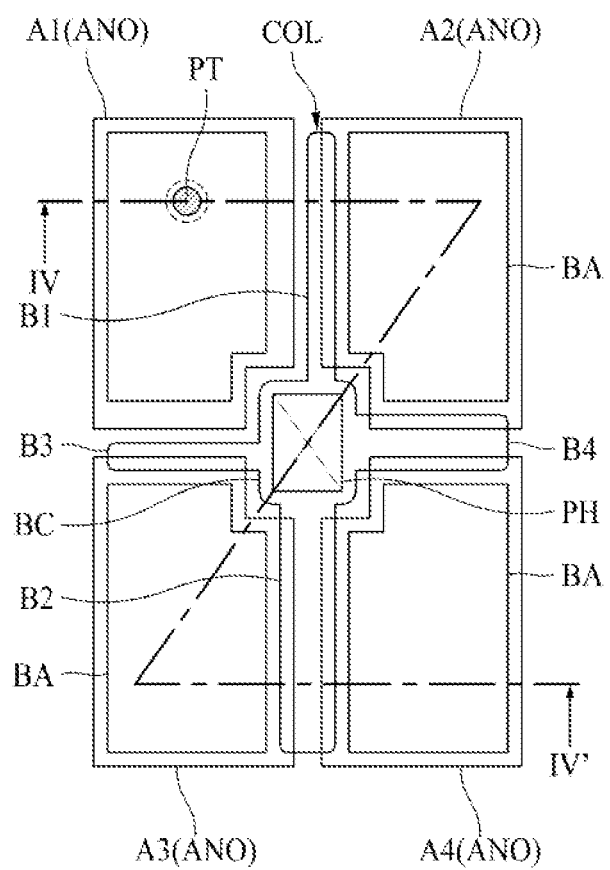
FIG. 9 is an enlarged plan view illustrating a structure in which defective pixel caused by foreign material are partially darkened, in the light emitting display according to the first aspect of the present disclosure.
Figure 10:
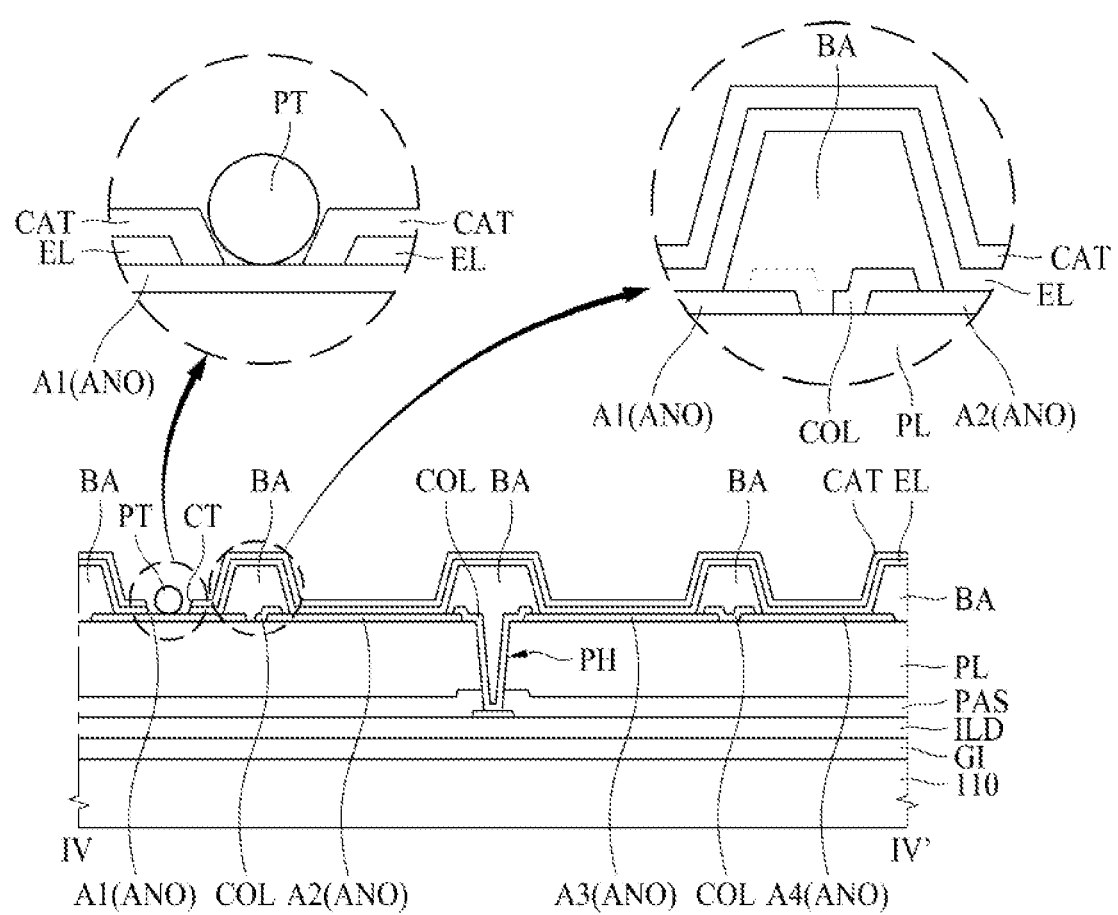
FIG. 10 is a cross-sectional view along cutting line IV-IV' in FIG. 9, for illustrating a structure in which defective pixel caused by foreign material are partially darkened, in the light emitting display according to the first aspect of the present disclosure.

Hereinafter, referring to FIGS. 9 and 10, a structure in which defective pixels due to foreign material are partially darkened in the light emitting display according to the first aspect of the present disclosure will be explained. FIG. 9 is an enlarged plan view illustrating a structure in which defective pixel caused by foreign material are partially darkened, in the light emitting display according to the first aspect of the present disclosure. FIG. 10 is a cross sectional view, along cutting line IV-IV' in FIG. 9, for illustrating a structure in which defective pixel caused by foreign material are partially darkened, in the light emitting display according to the first aspect of the present disclosure. In the following description, detailed explanations same with those previous description will not be duplicated. Parts shown with reference numerals in FIGS. 9 and 10 but not described may have the same structure as the previous description.

Under a condition in which the foreign material PT is dropped on the first unit electrode A1, the emission layer EL and the cathode electrode CAT may be sequentially stacked. In this case, as shown in left circle of FIG. 8, the emission layer EL may be stacked in a cut shape around the foreign material PT to form a predetermined gap G between the emission layer EL and the foreign material PT. After that, when the cathode electrode CAT is deposited thereon, the cathode electrode CAT may be also deposited in the gap G between the emission layer EL and the foreign material PT, so that the cathode electrode CAT and the first unit electrode A1 come into contact, and the electrical short is occurred.

Even though performing the aging process as explained with FIGS. 7 and 8, the disconnection pattern CT is not formed around the foreign material PT, and thus the first unit electrode A1 may continue to maintain an electrical short circuit condition with the cathode electrode CAT.

Under this condition, when the aging process is continuously performed, the conductive ohmic layer COL disposed around the first unit electrode A1, which is in a short circuit with cathode electrode CAT, may be melted and evaporated by a Joule heating phenomenon. The conductive ohmic layer COL is an organic material including an n-type or p-type dopant and has high conductivity, but has higher electrical resistance than the unit electrodes A1 to A4 of the anode electrode ANO including a metal material. The term 'conductive ohmic layer' means that it is an element that has conductivity but has higher electrical resistance than unit electrodes, as an element included in the anode electrode ANO, so that Joule heat is generated during the aging process under the short circuit state, and then melted and evaporated by this heat.

As shown in FIG. 10, the Joule heat is concentrated at the portions of the conductive ohmic layer COL contacting the right side and lower side of the first unit electrode A1 in contact with the cathode electrode CAT, and after some times, the portions of the conductive ohmic layer COL may be melted and evaporated. As the result, the first unit electrode A1 is electrically disconnected from the second unit electrode A2 electrically connected through the upper connection part B1. Similarly, the first unit electrode A1 is electrically disconnected from the third unit electrode A3 electrically connected through the left connection part B3.

Consequently, the first unit electrode A1 to which the foreign material PT has fallen is separated from the second unit electrode A2, the third unit electrode A3 and the fourth unit electrode A4 configuring the anode electrode ANO, and the first unit electrode A1 becomes a dark spot that does not work. In the light emitting display according to the present disclosure, instead of darkening the entire anode electrode ANO of the pixel to which the foreign material PT has fallen, only the unit electrode at which the foreign material PT has fallen may be selectively darkened to minimize the darkened area. Therefore, when a defect occurs in a pixel, the recovery efficiency is improved because the defect portion is processed as a dark spot to make it difficult to recognize.

Figure 11:
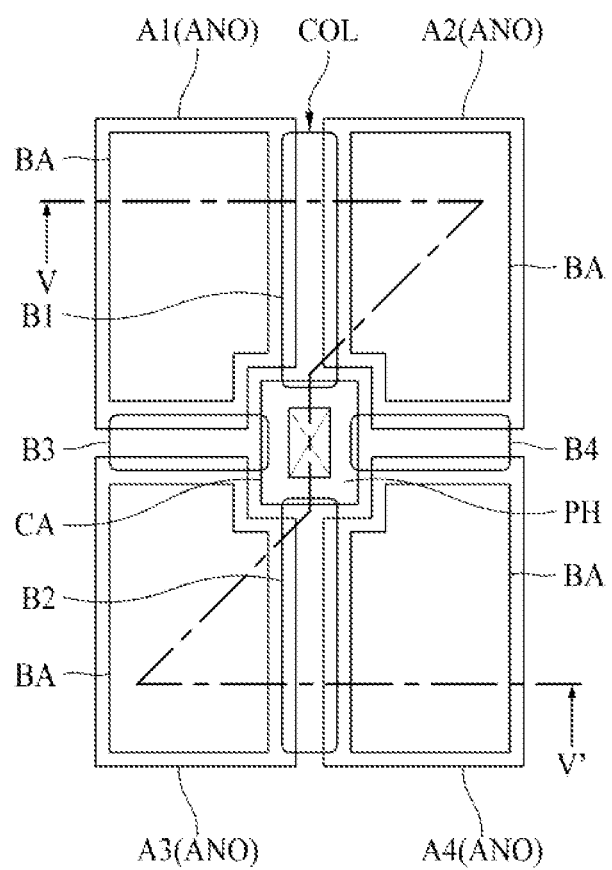
FIG. 11 is an enlarged plan view illustrating a structure of a pixel in the light emitting display according to a second aspect of the present disclosure.
Figure 12:
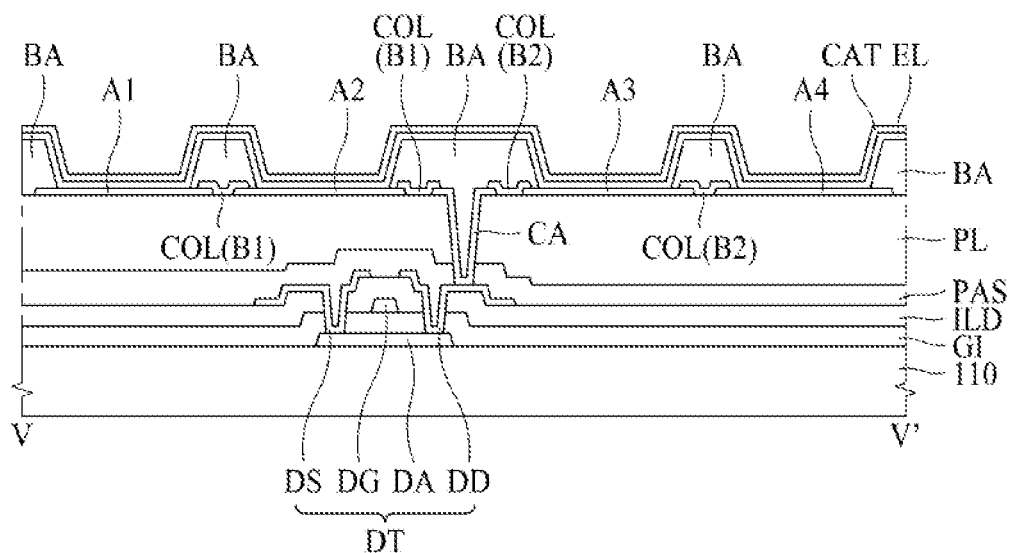
FIG. 12 is a cross-sectional view along cutting line V-V' in FIG. 11, for illustrating a structure of a pixel in the light emitting display according to the second aspect of the present disclosure.

Hereinafter, referring to FIGS. 11 and 12, a structure of a pixel in the light emitting display according to the second aspect of the present disclosure will be explained. FIG. 11 is an enlarged plan view illustrating a structure of a pixel in the light emitting display according to the second aspect of the present disclosure. FIG. 12 is a cross sectional view, along cutting line V-V' in FIG. 11, for illustrating a structure of a pixel in the light emitting display according to the second aspect of the present disclosure.

The light emitting display according to the second aspect of the present disclosure shown in FIGS. 11 and 12 may be very similar with the light emitting display according to the first aspect shown in FIGS. 5 and 6. The difference is that, in the first aspect, the element connected to the driving drain electrode DD through the pixel contact hole PH is made of a conductive ohmic layer COL, whereas, in the second aspect, the element connected to the driving drain electrode DD through the pixel contact hole is a central electrode CA made of the same material as the anode electrode ANO.

The pixel contact hole PH exposing some of the drain electrode DD of the driving thin film transistor DT may be formed to penetrating the planarization layer PL and/or passivation layer PAS. Therefore, the pixel contact hole PH may have a small area and a deep shape. When the conductive ohmic layer COL is deposited on such a pixel contact hole PH, the connectivity via the pixel contact hole PH may have a problem. For example, a problem may occur in that the conductive ohmic layer COL is not completely coated on the etched sidewall of the pixel contact hole PH. Further, as mentioned above, the conductive ohmic layer COL includes a dopant material for increasing conductivity, but has a much higher electrical resistance value than a metal material.

Therefore, the electrical resistance may increase in the electrical connection between the conductive ohmic layer COL and the drain electrode DD of the driving thin film transistor DT. This may cause a problem of image quality deterioration due to the increased resistance of connectivity between the anode electrode ANO and the driving thin film transistor DT. To prevent this problem, a portion of the anode electrode ANO covering the pixel contact hole PH may be formed of a metal material instead of the conductive ohmic layer COL. For example, the anode electrode ANO may further include a central electrode CA that is made of the same material as the unit electrodes A1 to A4, and overlapped with pixel contact hole PH to connect the drain electrode DD of the driving thin film transistor DT As shown in FIGS. 11 and 12, the light emitting display according to the second aspect of the present disclosure may comprise an anode electrode ANO formed on the planarization layer PL covering the driving thin film transistor DT. The anode electrode ANO may include a central electrode CA, a first unit electrode A1, a second unit electrode A2, a third unit electrode A3, a fourth unit electrode A4, and a conductive ohmic layer COL. Further, the conductive ohmic layer COL may include an upper connection part B1, a lower connection part B2, a left connection part B3, and a right connection part B4.

The upper connection part B1 may be connected to the first unit electrode A1, the second unit electrode A2 and the central electrode CA. The lower connection part B2 may be connected to the third unit electrode A3, the fourth unit electrode A4 and the central electrode CA. The left connection part B3 may be connected to the first unit electrode A1, the third unit electrode A3 and the central electrode CA. The right connection part B4 may be connected to the second unit electrode A2, the fourth unit electrode A4 and the central electrode CA.

Figure 13:
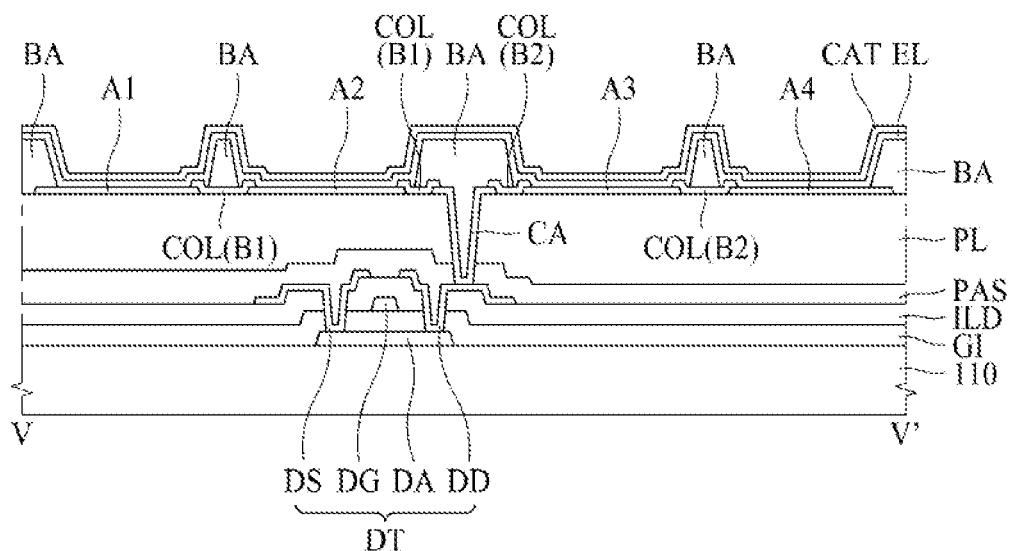
FIG. 13 is a cross-sectional view along cutting line V-V' in FIG. 11, for illustrating a structure of pixel in the light emitting display according to a third aspect of the present disclosure.

Hereinafter, referring to FIG. 13, a structure of a pixel in the light emitting display according to the third aspect of the present disclosure will be explained. FIG. 13 is a cross sectional view, along cutting line V-V' in FIG. 11, for illustrating a structure of pixel in the light emitting display according to the third aspect of the present disclosure.

The structure of the pixel according to the third aspect is very similar with that of the second aspect. The difference is that, in the third aspect, the bank BA does not fully cover the conductive ohmic layer COL but expose some portions of the conductive ohmic layer COL. Even though it is not shown in figures, in the first aspect, the bank BA may partially expose the conductive ohmic layer COL not completely covering it, as in the third aspect.

Figure 14:
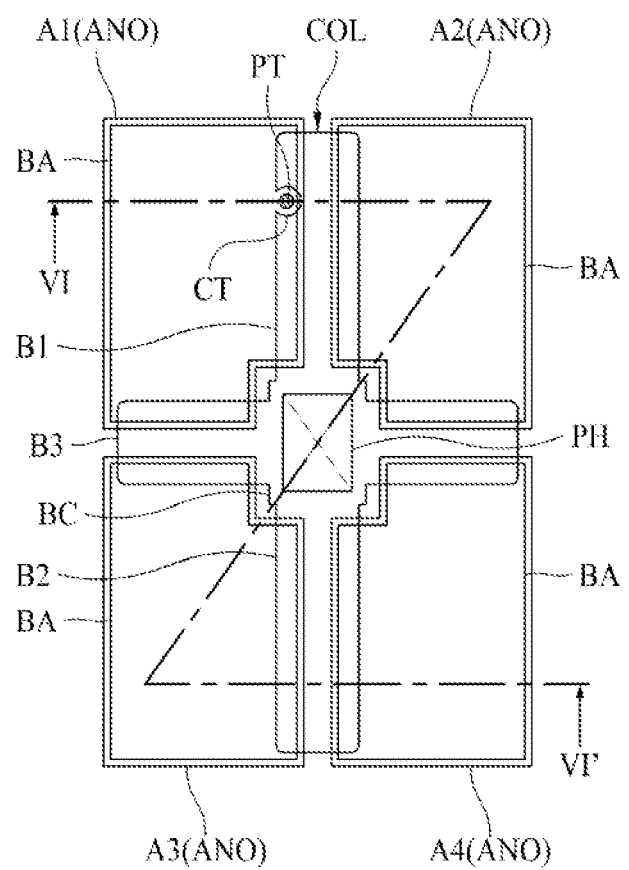
FIG. 14 is an enlarged plan view illustrating a structure in which defective pixel caused by foreign material are partially darkened, in the light emitting display according to the third aspect of the present disclosure.

In the structure in which the conductive ohmic layer COL is exposed from the bank BA, when the foreign material PT falls on to the bank BA, the dark spot size may be further reduced. Hereinafter, detailed description will be made, referring to FIG. 14. FIG. 14 is an enlarged plan view illustrating a structure in which defective pixel caused by foreign material are partially darkened, in the light emitting display according to the third aspect of the present disclosure.

A foreign material PT may be dropped on the first unit electrode A1. In particular, the foreign material PT may be dropped on the boundary area of the bank BA. In this case, the foreign material PT may be located on the upper connection part B1 of the conductive ohmic layer COL exposed from the bank BA. When the aging process is conducted under this condition, a disconnection pattern CT may be formed as the upper connection part B1 as the conductive ohmic layer COL melts around the foreign material PT and surrounds the foreign material PT in an island shape. As the conductive ohmic layer COL around the foreign material PT is evaporated, the first unit electrode A1 excluding the foreign material PT may be restored to a normal state. Therefore, the entire first unit electrode A1 to which the foreign material PT has fallen may not be the darkened spot, but it has been restored.

In the third aspect, by exposing a portion of the conductive ohmic layer COL without covering the entire bank BA, when the foreign material PT falls on the boundary of the bank BA, only the vicinity of the foreign material PT is disconnected to reduce the darken spot area, and other area of the anode electrode ANO becomes to normal working state. In the third aspect, when a defective pixel due to a foreign material is generated, an effect of reducing the rate of defective products may be expected by minimizing the area for making dark spots.

Figure 15:
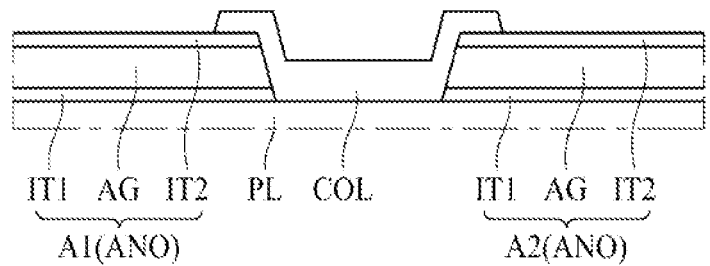
FIG. 15 is a cross-sectional view illustrating a structure of an anode electrode in the light emitting display according to a fourth aspect of the present disclosure.

Until now, the connection and arrangement structure of the unit electrodes A1 to A4 of the anode electrode ANO and the conductive ohmic layer COL have been described. Hereinafter, various cross sectional structures showing how the conductive ohmic layer COL is stacked with the unit electrodes A1 to A4 of the anode electrode ANO will be described. Referring to FIG. 15, a structure of the anode electrode in the light emitting display according to the fourth aspect of the present disclosure will be explained. FIG. 15 is a cross sectional view illustrating a structure of the anode electrode in the light emitting display according to the fourth aspect of the present disclosure.

Referring to FIG. 15, an anode electrode ANO is formed on the planarization layer PL. The first unit electrode A1 and the second unit electrode A2 are spaced apart from each other by a predetermined distance. The first unit electrode A1 and the second unit electrode A2 may have the same stacked structure. For example, a first transparent conductive layer IT1 is disposed at bottom layer. The first transparent conductive layer IT1 may be made of a transparent conductive material such as indium-tin-oxide (ITO) or indium-zinc-oxide (IZO). On the first transparent conductive layer IT1, a metal layer AG having high light reflectance and low resistance is stacked. For example, the metal layer AG may be formed of a material having low electrical resistance such as silver (Ag) and copper (Cu). A second transparent conductive layer IT2 is disposed on the metal layer AG. The second transparent conductive layer IT2 may be made of the same material as the first transparent conductive layer IT1.

A conductive ohmic layer COL is disposed between the first unit electrode A1 and the second unit electrode A2 to electrically connect the first unit electrode A1 and the second unit electrode A2. In particular, the conductive ohmic layer COL may be stacked to contact the second transparent conductive layer IT2 of the first unit electrode A1 and the second unit electrode A2. The first unit electrode A1 and the second unit electrode A2 are formed by sequentially stacking the first transparent conductive layer IT1, the metal layer AG, and the second transparent conductive layer IT2 and then pattering them. After that, a conductive organic material is deposited and patterned to form the conductive ohmic layer COL. Therefore, the conductive ohmic layer COL is in contact with the second transparent conductive layer IT2, which is the upper layer of the first unit electrode A1 and the second unit electrode A2. It also contacts side surface of the first transparent conductive layer IT1, the metal layer AG, and the second transparent conductive layer IT2, which are etched sides of the first unit electrode A1 and the second unit electrode A2.

Even though it is not shown in figures, the first transparent conductive layer IT1 may have a structure and shape connecting each of the unit electrodes A1 to A4. In this case, since the first transparent conductive layer IT1 may need to be removed as the conductive ohmic layer COL is vaporized, the sheet resistance of the first transparent conductive layer IT1 has the same level as that of the conductive ohmic layer COL. For example, the first transparent conductive layer IT1 may have a thickness equal to or less than 100 Å, and be disposed between the unit electrodes A1 to A4 to connect them each other.

The foreign material PT falls between the first unit electrode A1 and the second unit electrode A2. In this case, by conducting the aging process, the conductive ohmic layer COL connecting the first unit electrode A1 and the second unit electrode A2 is melted and disconnected, so that only the defective unit electrode may be darkened.

Figure 16:
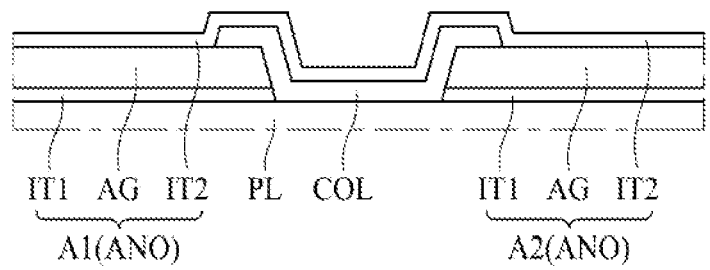
FIG. 16 is a cross-sectional view illustrating a structure of an anode electrode in the light emitting display according to a fifth aspect of the present disclosure.

Hereinafter, referring to FIG. 16, a structure of the anode electrode in the light emitting display according to the fifth aspect of the present disclosure will be explained. FIG. 16 is a cross sectional view illustrating a structure of the anode electrode in the light emitting display according to the fifth aspect of the present disclosure.

Referring to FIG. 16, an anode electrode ANO is disposed on the planarization layer PL. The first unit electrode A1 and the second unit electrode A2 are spaced apart from each other by a predetermined distance. The first unit electrode A1 and the second unit electrode A2 may have the same stacked structure. For example, a first transparent conductive layer IT1 is disposed at bottom layer. The first transparent conductive layer IT1 may be made of a transparent conductive material such as indium-tin-oxide (ITO) or indium-zinc-oxide (IZO). On the first transparent conductive layer IT1, a metal layer AG having high light reflectance and low resistance is stacked. For example, the metal layer AG may be formed of a material having low electrical resistance such as silver (Ag) and copper (Cu).

A conductive ohmic layer COL is disposed between the first unit electrode A1 and the second unit electrode A2 to electrically connect the first unit electrode A1 and the second unit electrode A2. In particular, the conductive ohmic layer COL may be stacked to contact the metal layer AG of the first unit electrode A1 and the second unit electrode A2.

The second transparent conductive layer IT2 is stacked on the conductive ohmic layer COL of the first unit electrode A1 and the second unit electrode A2. The second transparent conductive layer IT2 may be made of a transparent conductive material such as indium-tin-oxide (ITO) or indium-zinc-oxide (IZO). The second transparent conductive layer IT2 may have the electrical conductivity and the electrical resistance similar with the conductive ohmic layer COL. Therefore, the second transparent conductive layer IT2 connecting between the first unit electrode A1 and the second unit electrode A2 may work as the conductive ohmic layer COL, so some portions of the second transparent conductive layer IT2 may be removed by Joule heating during the aging process.

Even though it is not shown in the figures, the first transparent conductive layer IT1 may have a structure and shape connecting each of the unit electrodes A1 to A4. In this case, since the first transparent conductive layer IT1 may need to be removed as the conductive ohmic layer COL is vaporized, the sheet resistance of the first transparent conductive layer IT1 has the same level as that of the conductive ohmic layer COL. For example, the first transparent conductive layer IT1 may have a thickness equal to or less than 100 Å, and be disposed between the unit electrodes A1 to A4 to connect them each other.

Figure 17:
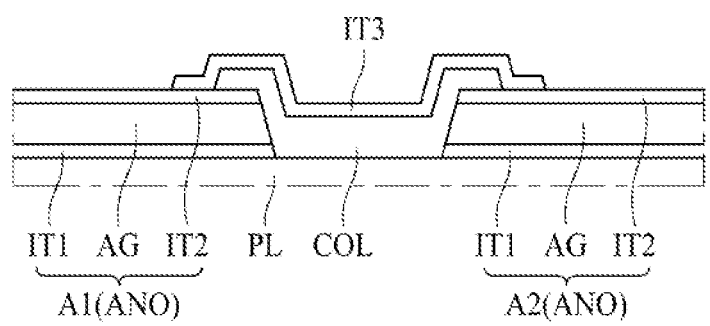
FIG. 17 is a cross-sectional view illustrating a structure of an anode electrode in the light emitting display according to a sixth aspect of the present disclosure.

Hereinafter, referring to FIG. 17, a structure of the anode electrode in the light emitting display according to the sixth aspect of the present disclosure will be explained. FIG. 17 is a cross sectional view illustrating a structure of the anode electrode in the light emitting display according to the sixth aspect of the present disclosure.

Referring to FIG. 17, an anode electrode ANO is formed on the planarization layer PL. The first unit electrode A1 and the second unit electrode A2 are spaced apart from each other by a predetermined distance. The first unit electrode A1 and the second unit electrode A2 may have the same stacked structure. For example, a first transparent conductive layer IT1 is disposed at bottom layer. On the first transparent conductive layer IT1, a metal layer AG having high light reflectance and low resistance is stacked. For example, the metal layer AG may be formed of a material having low electrical resistance such as silver (Ag) or copper (Cu). A second transparent conductive layer IT2 is disposed on the metal layer AG. The first transparent conductive layer IT1 and the second transparent conductive layer IT2 may be made of a transparent conductive material such as indium-tin-oxide (ITO) or indium-zinc-oxide (IZO).

A conductive ohmic layer COL is disposed between the first unit electrode A1 and the second unit electrode A2 to electrically connect the first unit electrode A1 and the second unit electrode A2. In particular, the conductive ohmic layer COL may be stacked to contact the second transparent conductive layer IT2 of the first unit electrode A1 and the second unit electrode A2.

A third transparent conductive layer IT3 is deposited on the second transparent conductive layer IT2 of the first unit electrode A1 and the second unit electrode A2 and the conductive ohmic layer COL. The third transparent conductive layer IT3 may cover the conductive ohmic layer COL, contact some portions of the second transparent conductive layer IT2 of the first unit electrode A1, and contact some portions of the second transparent conductive layer IT2 of the second unit electrode A2. When the resistance of the conductive ohmic layer is too high than that of the first unit electrode A1 and the second unit electrode A2, the third transparent conductive layer IT3 may be used to lower the resistance of the conductive ohmic layer COL to a level similar to that of the second transparent conductive layer IT2. The third transparent conductive layer IT3 and the conductive ohmic layer COL connecting between the first unit electrode A1 and the second unit electrode A2 may be broken (or disconnected) by Joule heating in the aging process.

Even though it is not shown in the figures, the first transparent conductive layer IT1 may have a structure and shape connecting each of the unit electrodes A1 to A4. In this case, since the first transparent conductive layer IT1 may need to be removed as the conductive ohmic layer COL is vaporized, the sheet resistance of the first transparent conductive layer IT1 has the same level as that of the conductive ohmic layer COL. For example, the first transparent conductive layer IT1 may have a thickness equal to or less than 100 Å, and be disposed between the unit electrodes A1 to A4 to connect them each other.

Figure 18:
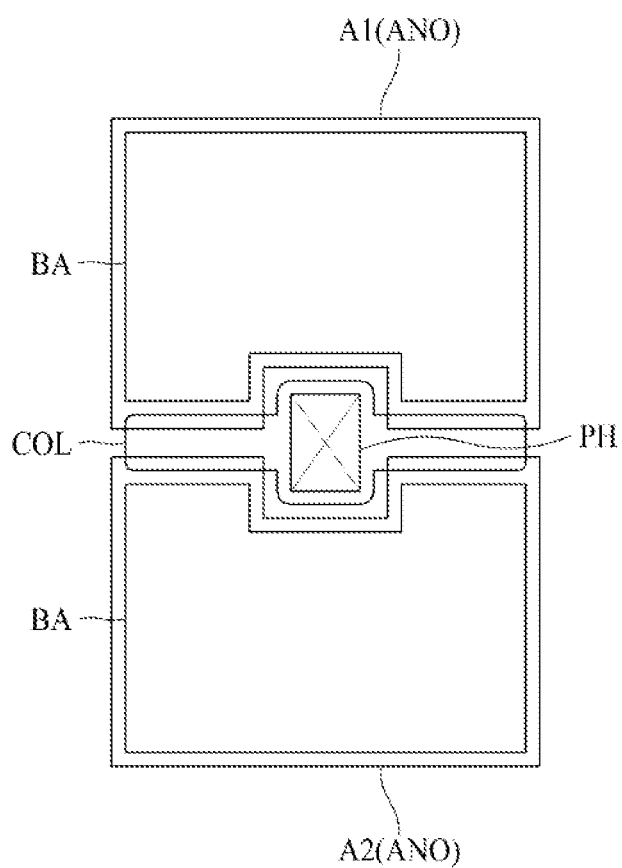
FIG. 18 is an enlarged plan view illustrating a structure of an anode electrode in the light emitting display according to a seventh aspect.

Hereinafter, referring to FIG. 18, a structure of the anode electrode in the light emitting display according to the seventh aspect of the present disclosure will be explained. FIG. 18 is an enlarged plan view illustrating a structure of the anode electrode in the light emitting display according to the seventh aspect.

The above mentioned anode electrodes are divided into four unit electrodes A1 to A4, respectively. However, it is not limited thereto. The anode electrode may be divided into two unit electrodes, six unit electrodes or eight unit electrodes.

FIG. 18 illustrates the case in which the anode electrode is divided into two unit electrodes. The anode electrode ANO, as shown in FIG. 18, may include a first unit electrode A1, a second unit electrode A2 and a conductive ohmic layer COL. The first unit electrode A1 may be disposed at the upper side from the pixel contact hole PH, and the second unit electrode A2 may be disposed below the first unit electrode A1 by a predetermined distance. However, it is not limited thereto. The anode electrode may have a two-part structure in another way, for example, left side and right side.

The conductive ohmic layer COL may be disposed as connecting the first unit electrode A1 and the second unit electrode A2, and covering the pixel contact hole PH. With this structure, when a defect is occurred at the first unit electrode or the second unit electrode A2 by falling of foreign material thereon, it is possible to recover the defected unit electrode into normal condition by forming a disconnection pattern around the foreign material using an aging process. Alternatively, the conductive ohmic layer COL connected to the unit electrode to which the foreign material has fallen may be evaporated and/or removed to darken the unit electrode to which the foreign material has fallen. So, the unit electrode without the foreign material may be normally driven.

Figure 19:
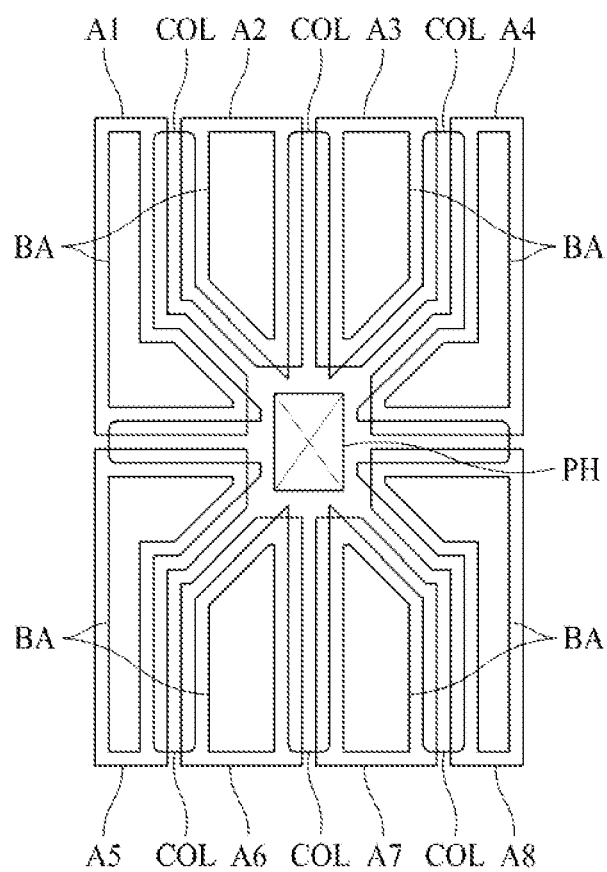
FIG. 19 is an enlarged plan view illustrating a structure of an anode electrode in the light emitting display according to an eighth aspect of the present disclosure.

Hereinafter, referring to FIG. 19, a structure of the anode electrode in the light emitting display according to the eighth aspect of the present disclosure will be explained. FIG. 19 is an enlarged plan view illustrating a structure of the anode electrode in the light emitting display according to the eighth aspect of the present disclosure.

FIG. 19 illustrates the anode electrode ANO disposed in one pixel of the light emitting display according to the eighth aspect of the present disclosure which is divided into eight unit electrodes. For example, the anode electrode may include a first unit electrode A1, a second unit electrode A2, a third unit electrode A3, a fourth unit electrode A4, a fifth unit electrode A5, a sixth unit electrode A6, a seventh unit electrode A7, and an eighth unit electrode A8. These eight unit electrodes A1 to A8 are separated with a predetermined distance, each other.

The conductive ohmic layer COL may be disposed as connecting between neighboring two unit electrodes of the eight unit electrodes A1 to A8, and covering the pixel contact hole PH. With this structure, a foreign material falls on one of the eight unit electrodes A1 to A8. In this case, by conducting the aging process, the conductive ohmic layer COL connected to the unit electrode to which the foreign material has fallen is evaporated and removed, so that the unit electrode to which the foreign material has fallen is darkened, and other unit electrodes without the foreign material may be normally driven.

Figure 20A:
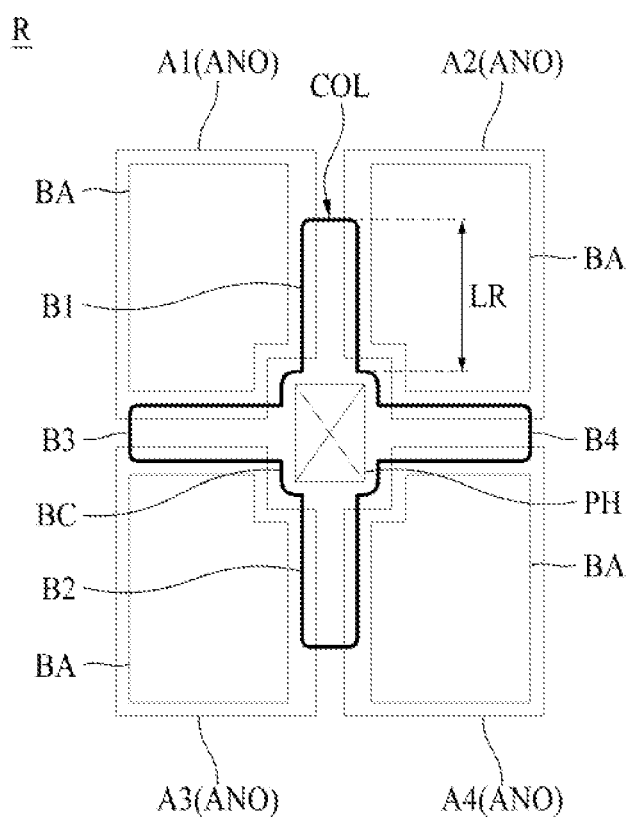
FIGS. 20A, 20B and 20C are enlarged plan views illustrating structures of a red pixel, a green pixel and a blue pixel in the light emitting display according to the present disclosure.
Figure 20B:
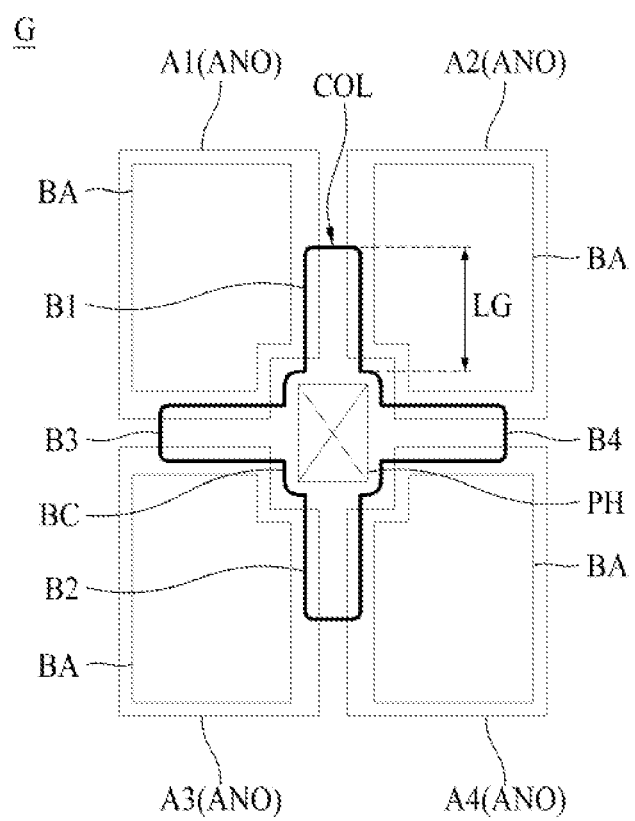
Figure 20C:
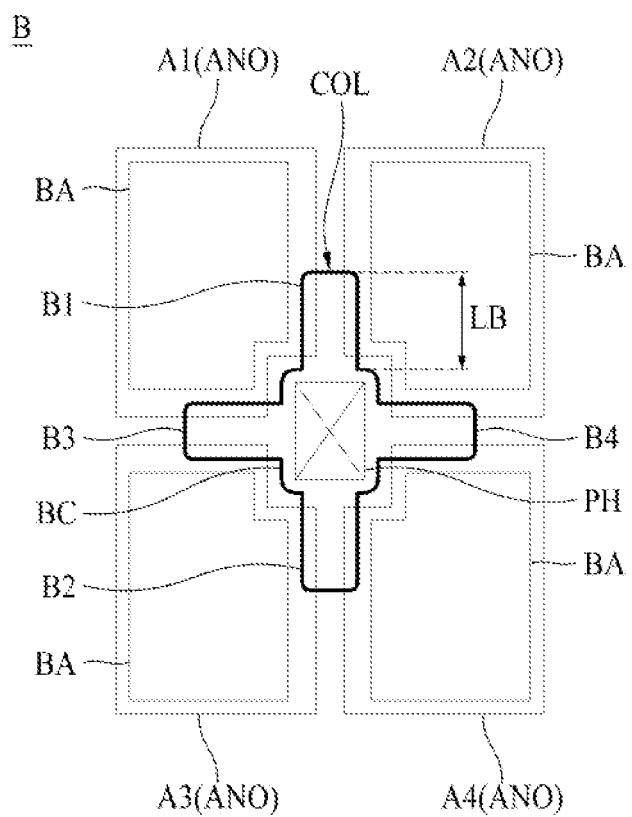

Hereinafter, referring to FIGS. 20A to 20C, a structure of the anode electrode disposed each sub-pixel when any one pixel includes three sub-pixels in the light emitting display according to the above mentioned aspects will be explained. FIGS. 20A to 20C are enlarged plan views illustrating structures of the red pixel, the green pixel and the blue pixel in the light emitting display according to the present disclosure.

Each pixel includes a red pixel R, a green pixel G and a blue pixel B. Each of the red pixel R, the green pixel G and the blue pixel B may include anode electrode having a structure corresponding to any one of the first to the eight aspects explained above. Otherwise, each sub pixel may include a structure corresponding to a structure combining two or more of these aspects.

However, the red pixel R, the green pixel G and the blue pixel B may have different driving currents. The aging process may be an operation performed by applying a driving current for the sub-pixel. In the aging process, the conductive ohmic layer COL may be removed or not depending on the driving current of the driving thin film transistor DT driving the light emitting diode OLE. Therefore, the length of the conductive ohmic layer COL may be configured to have different length for each sub pixel according to the limit current of the driving thin film transistor DT.

The driving electric current may flow through the upper connection part B1 of the conductive ohmic layer COL disposed between the first unit electrode A1 and the second unit electrode A2 located in the red pixel R. Therefore, the length LR of the upper connection part B1 may be defined as a width of the line through which the driving electric current flows. As the length LR of the upper connection part B1 is longer, the width of the line is wider, so the resistance of the line is lowered. As the length LR of the upper connection part B1 is shorter, the width of the line is narrower, so the resistance of the line is increased. Accordingly, the length of the conductive ohmic layer COL disposed in the red pixel R may be determined in consideration of the limit current for driving the red pixel R.

Similarly, the length of the conductive ohmic layer COL disposed in the green pixel G may also be determined in consideration of the limit current for driving the green pixel G. In addition, the length of the conductive ohmic layer COL disposed in the blue pixel B may also be determined in consideration of the limit current for driving the blue pixel B.

For example, the electrical limit current for driving the red pixel R may be 9.45 μA, the limit current for driving the green pixel G may be 6.41 μA, and the limit current for driving the blue pixel B may be 5.07 μA. Therefore, the length of the conductive ohmic layer COL may be varied according to the limit current of the sub pixel. When the limit current is high, the length of the conductive ohmic layer COL may be long to reduce the connection resistance. On the other hand, when the limit current is low, the resistance may be increased by shortening the length of the conductive ohmic layer COL.

In the case of the limit current is high, when the length of the conductive ohmic layer COL is made too short, the resistance may be too high, and thus the conductive ohmic layer COL may be melted and evaporated even in a normal pixel without foreign materials during an aging process. On the other hand, in the case of the limit current is low, when the length of the conductive ohmic layer COL is made to long, the resistance may be too low, and thus the conductive ohmic layer COL may not melt during the aging process even in a defective pixel with foreign material during an aging process. So, a problem of not recovering a defective pixel may be occurred.

As shown in FIG. 20A, in consideration of the limit current, the conductive ohmic layer COL of the red pixel R may have a length corresponding to the width of the anode electrode ANO in the horizontal direction. In the first aspect, the upper connection part B1 has the same length as the lower connection part B2. However, the left connection part B3 has shorter length than the upper connection part B1. This shows a case where the conductive ohmic layer COL around the unit electrode to which the foreign material has fallen may be removed by the aging process without considering the limit current. However, the upper connection part B1, the lower connection part B2, the left connection part B3 and the right connection part B4 may have the same first length LR.

As shown in FIG. 20B, the conductive ohmic layer COL of the green pixel G may have a second length LG shorter than the first length LR in consideration of the limit current for driving the green pixel G. In addition, as shown in FIG. 20C, the conductive ohmic layer COL of the blue pixel B may have a third length LB shorter than the second length LG in consideration of the limit current for driving the blue pixel B.

Even though it is not shown in figures, the pixel may include a red pixel, a green pixel, a blue pixel and a white pixel. In this case, the conductive ohmic layer COL of the white pixel may be defined by considering the limit current for driving the white pixel. For example, when the limit current for driving the white pixel is 3.33 μA, the conductive ohmic layer of the white pixel may be same as or shorter than the third length LB of the conductive ohmic layer of the blue pixel B.

The features, structures, effects and so on described in the above example aspects of the present disclosure are included in at least one example aspect of the present disclosure, and are not necessarily limited to only one example aspect. Furthermore, the features, structures, effects and the like explained in at least one example aspect may be implemented in combination or modification with respect to other example aspects by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that aspects of the present disclosure cover the various substitutions, modifications, and variations of the present disclosure, provided they come within the scope of the appended claims and their equivalents. These and other changes may be made to the aspects in light of the above detailed description. In general, in the following claims, the terms used should not be construed to limit the claims to the specific example aspects disclosed in the specification and the claims, but should be construed to include all possible aspects along with the full scope of equivalents to which such claims are entitled. Accordingly, the claims are not limited by the disclosure.

What is claimed is:

1. A light emitting display comprising:
a plurality of pixels disposed on a substrate,
wherein each of the plurality of pixels includes:
a first unit electrode;
a second unit electrode separated apart from the first unit electrode with a predetermine distance;
a conductive ohmic layer disposed between the first unit electrode and the second unit electrode;
a bank disposed on the conductive ohmic layer, covering circumferences of the first unit electrode and the second unit electrode, and exposing each central portion of the first unit electrode and the second unit electrode;
an emission layer disposed on the first unit electrode, the second unit electrode and the bank; and
a cathode electrode disposed on the emission layer.

2. The light emitting display according to claim 1, wherein the bank covers the conductive ohmic layer.

3. The light emitting display according to claim 1, wherein the bank covers a central portion of the conductive ohmic layer and exposes circumferences of the conductive ohmic layer.

4. The light emitting display according to claim 3, wherein, among the plurality of pixels, a pixel having a foreign material on the conductive ohmic layer exposed from the bank on the first unit electrode includes a disconnection gap formed by removing the conductive ohmic layer around the foreign material.

5. The light emitting display according to claim 1, further comprising:
a thin film transistor disposed within the plurality of pixels;
a planarization layer covering the thin film transistor; and
a pixel contact hole exposing portions of the thin film transistor by penetrating the planarization layer, wherein the first unit electrode, the second unit electrode, and the conductive ohmic layer are disposed on the planarization layer, and
wherein the conductive ohmic layer is connected with the thin film transistor via the pixel contact hole.

6. The light emitting display according to claim 1, further comprising:
a thin film transistor within the pixel on the substrate;
a planarization layer covering the thin film transistor;
a pixel contact hole exposing portions of the thin film transistor by penetrating the planarization layer; and
a central electrode connecting the thin film transistor via the pixel contact hole, and connecting the first unit electrode and the second unit electrode through the conductive ohmic layer,
wherein the first unit electrode, the second unit electrode, and the conductive ohmic layer are disposed on the planarization layer.

7. The light emitting display according to claim 1, wherein the first unit electrode and the second unit electrode include:
a first transparent conductive layer;
a metal layer on the first transparent conductive layer; and
a second transparent conductive layer on the metal layer,
wherein the conductive ohmic layer connects between the first unit electrode and the second unit electrode.

8. The light emitting display according to claim 7, further comprising a third transparent conductive layer on the conductive ohmic layer, and connecting the second transparent conductive layers of the first unit electrode and the second unit electrode.

9. The light emitting display according to claim 7, wherein the conductive ohmic layer contacts an upper surface of the second transparent conductive layer of the first unit electrode and an upper surface of the second transparent conductive layer of the second unit electrode.

10. The light emitting display according to claim 7, wherein the conductive ohmic layer contacts a first bottom surface of the second transparent conductive layer on the metal layer of the first unit electrode, and contacts a second bottom surface of the second transparent conductive layer on the metal layer of the second unit electrode.

11. The light emitting display according to claim 1, wherein the each pixel further includes:
a third unit electrode separated apart from the first unit electrode and the second unit electrode; and
a fourth unit electrode separated apart from the first unit electrode, the second unit pixel and the third unit electrode,
wherein the conductive ohmic layer connects between the first unit electrode and the third unit electrode, between the second unit electrode and the fourth unit electrode, and between the third unit electrode and the fourth unit electrode.

12. The light emitting display according to claim 1, wherein the plurality of pixels includes:
a red pixel having a first conductive ohmic layer with a first length;
a green pixel having a second conductive ohmic layer with second length shorter than the first length; and
a blue pixel having a third conductive ohmic layer with third length shorter than the second length.

13. The light emitting display according to claim 1, wherein the plurality of pixels includes a red pixel, a green pixel and a blue pixel, and
wherein the conductive ohmic layer disposed in the red pixel, the green pixel and the blue pixel has a length different from each other.

14. The light emitting display according to claim 13, wherein the length of the conductive ohmic layer is proportional to limit current for driving the red pixel, the green pixel, and the blue pixel.

15. A light emitting display comprising:
a plurality of pixels each including a first unit electrode, a second unit electrode, a third unit electrode and a fourth unit electrode;
a conductive ohmic layer electrically connecting the first, second, third and fourth unit electrodes;
a bank disposed on the conductive ohmic layer and covering circumferences of the first, second, third and fourth unit electrodes;
an emission layer disposed on the first, second, third and fourth unit electrodes and the bank; and
a cathode electrode disposed on the emission layer.

16. The light emitting display according to claim 15, wherein the conductive ohmic layer has a '+' shape and a central area overlapping with a pixel contact hole.

17. The light emitting display according to claim 16, wherein the conductive ohmic layer includes an upper connection part extending upward from the central area, a lower connection part extending downward from the central area, a left connection part extending leftward from the central area, and a right connection part extending rightward from the central area.

18. The light emitting display according to claim 16, wherein the conductive ohmic layer includes a domain material made of a resin material with a high electron mobility and a dopant for lowering a barrier energy of the domain material.

19. The light emitting display according to claim 15, wherein the plurality of pixels includes a red pixel, a green pixel and a blue pixel, and
wherein the conductive ohmic layer disposed in the red pixel, the green pixel and the blue pixel has a different length.

20. The light emitting display according to claim 19, wherein a length of the conductive ohmic layer disposed in the red pixel, the green pixel and the blue pixel is proportional to limit current for driving the red pixel, the green pixel, and the blue pixel.

* * * * *